(12) United States Patent
Han et al.

(10) Patent No.: US 9,099,372 B2
(45) Date of Patent: Aug. 4, 2015

(54) COMPLEMENTARY METAL OXIDE SEMICONDUCTOR IMAGE SENSOR AND OPERATING METHOD THEREOF

(75) Inventors: Gunhee Han, Gyeonggi-do (KR); Eunsoo Chang, Seoul (KR); Dongmyung Lee, Seoul (KR); Ji Min Cheon, Gyeonggi-do (KR)

(73) Assignee: Industry-Academic Corporation Foundation, Yonsei University, Seoul (KR)

( * ) Notice: Subject to any disclaimer, the term of this patent is extended or adjusted under 35 U.S.C. 154(b) by 236 days.

(21) Appl. No.: 13/816,313

(22) PCT Filed: Sep. 17, 2010

(86) PCT No.: PCT/KR2010/006388
§ 371 (c)(1),
(2), (4) Date: Mar. 8, 2013

(87) PCT Pub. No.: WO2012/020884
PCT Pub. Date: Feb. 16, 2012

(65) Prior Publication Data
US 2013/0168533 A1    Jul. 4, 2013

(30) Foreign Application Priority Data
Aug. 12, 2010  (KR) .......................... 10-2010-0077923

(51) Int. Cl.
*H01L 27/146* (2006.01)
*H04N 5/355* (2011.01)
(Continued)

(52) U.S. Cl.
CPC ...... *H01L 27/14645* (2013.01); *H04N 5/35527* (2013.01); *H04N 5/3698* (2013.01); *H04N 5/374* (2013.01)

(58) Field of Classification Search
USPC ................. 250/214.1, 214 R, 214 DC, 208.1; 257/431; 348/229.1, 297, 272, 298, 348/302
See application file for complete search history.

(56) References Cited

U.S. PATENT DOCUMENTS

| 6,002,123 A | 12/1999 | Suzuki |
| 7,787,038 B2 | 8/2010 | Mabuchi |

(Continued)

FOREIGN PATENT DOCUMENTS

| JP | 10248035 A | 9/1998 |
| KR | 100265364 B1 | 9/2000 |

(Continued)

OTHER PUBLICATIONS

International Search Report form PCT/ISA/210 for International Application No. PCT/KR2010/006388 dated Sep. 2, 2011.

*Primary Examiner* — Francis M Legasse, Jr.
(74) *Attorney, Agent, or Firm* — Harness, Dickey & Pierce, P.L.C.

(57) ABSTRACT

The inventive concept relates to a CMOS image sensor and an operating method of the CMOS image sensor. The operating method according to an embodiment of the inventive concept includes generating photoelectrons at a photo sensor element during a first time; generating photoelectrons at the photo sensor element during a second time shorter than the first time; and sensing the photoelectrons generated at the photo sensor element. A gate voltage of a transfer transistor connected to the photo sensor element is set differently at the first time and the second time. With an embodiment of the inventive concept, a dynamic range of the CMOS image sensor increases.

17 Claims, 10 Drawing Sheets

(51) Int. Cl.
*H04N 5/369* (2011.01)
*H04N 5/374* (2011.01)

(56) References Cited

U.S. PATENT DOCUMENTS

2004/0130641 A1 7/2004 Mabuchi
2008/0111906 A1 5/2008 Kim et al.
2012/0075499 A1* 3/2012 Kawaguchi et al. ....... 348/229.1

FOREIGN PATENT DOCUMENTS

| KR | 100765252 | B1 | 10/2007 |
| KR | 1020080041912 | A | 5/2008 |
| KR | 100933141 | B1 | 12/2009 |
| KR | 101031982 | B1 | 5/2011 |

* cited by examiner

COMPLEMENTARY METAL OXIDE SEMICONDUCTOR IMAGE SENSOR AND OPERATING METHOD THEREOF

CROSS-REFERENCE TO RELATED APPLICATIONS

This is a National Phase of PCT/KR2010/006388 filed Sep. 17, 2010, and claims priority under 35 U.S.C. §120 to Korean Patent Application number 10-2010-0077923, filed Aug. 12, 2010, the entrie contents of which are hereby incorporated by reference.

TECHNICAL FIELD

The inventive concepts described herein relate to an image sensor, and more particularly, relate to a CMOS image sensor and an operating method thereof.

BACKGROUND ART

Image sensors may include a CCD (Charge Coupled Device) image sensor, a CMOS (Complementary Metal Oxide Semiconductor) image sensor, and so on. A driving manner of the CMOS image sensor may be simple in comparison with the CCD image sensor and a variety of scanning can be implemented. Further, a single processing circuit can be integrated into a single chip, the CMOS image sensor may be small-sized and a manufacturing cost of the CMOS image sensor may be low.

In recent years, the CMOS image sensor may be widely applied to a camera for video conference, a digital still camera, a PC camera, a next-generation personal portable communications device with an image information transmitting function, and so on. To enhance a characteristic of the CMOS image sensor, there may be required a technique to improve color expression through an increase in a dynamic range.

DETAILED DESCRIPTION

Technical Problem

The invention concepts provide a CMOS image sensor and an operating method thereof capable of increasing a dynamic range.

Technical Solution

An operating method of a CMOS image sensor according to an embodiment of the inventive concept comprises generating photoelectrons at a photo sensor element during a first time; generating photoelectrons at the photo sensor element during a second time shorter than the first time; and sensing the photoelectrons generated at the photo sensor element, wherein a gate voltage of a transfer transistor connected to the photo sensor element is set differently at the first time and the second time.

In example embodiments, the gate voltage of the transfer transistor during the first time is set to a transfer adjusting voltage higher than a ground voltage and lower than a voltage for turning on the transfer transistor.

In example embodiments, the gate voltage of the transfer transistor during the second time is set to a voltage lower than the transfer adjusting voltage.

In example embodiments, the transfer gate voltage is a ground voltage during the second time.

In example embodiments, the photoelectrons generated during the first time are accumulated at the photo sensor element.

In example embodiments, the photoelectrons generated during the second time are accumulated at the photo sensor element where the photoelectrons generated during the first time are accumulated.

In example embodiments, the transfer transistor has a source connected to the photo sensor element and a drain connected to a floating diffusion node. The sensing the photoelectrons generated at the photo sensor element comprises resetting the floating diffusion node with a power supply voltage; and transferring the photoelectrons generated during the first and second times to the floating diffusion node.

In an operating method of a CMOS image sensor according to an embodiment of the inventive concept, the CMOS image sensor includes a photo sensor element and a transfer transistor having a charge path formed between the photo sensor element and a floating diffusion node. A gate voltage level of the transfer transistor is changed while the photo sensor element generates photoelectrons.

In example embodiments, a gate voltage level of the transfer transistor is changed from a first voltage to a second voltage lower than the first voltage while the photo sensor element generates photoelectrons.

In example embodiments, the first voltage is lower than a voltage for turning on the transfer transistor and higher than a ground voltage.

In example embodiments, the second voltage is a ground voltage.

In example embodiments, the first voltage is applied to a gate of the transfer transistor during a first time and the second voltage is applied to the gate of the transfer transistor during a second time shorter than the first time.

In example embodiments, photoelectrons generated during the first and second times are accumulated at the photo sensor element.

In example embodiments, the photoelectrons accumulated at the photo sensor element during the first and second times are transferred to the floating diffusion node.

A CMOS image sensor according to an embodiment of the inventive concept comprises a photo sensor element which generates photoelectrons during first and second times; and a transfer transistor which forms a charge path between the photo sensor element and a floating diffusion node in response to a transfer signal, wherein a voltage level of the transfer signal is set to be different during the first and second times.

In example embodiments, a voltage level of the transfer signal during the first time is a first voltage lower than a voltage for turning on the transfer transistor and higher than a ground voltage and a voltage level of the transfer signal during the second time is a second voltage lower than the first voltage.

In example embodiments, the first time is longer than the second time.

In example embodiments, photoelectrons generated at the first and second times are accumulated at a well of the photo sensor element.

A CMOS image sensor according to an embodiment of the inventive concept comprises a photo sensor element which generates photoelectrons during a first time and a second time shorter than the first time; a first transistor which is connected between the photo sensor element and a floating diffusion node and forms a charge path in response to a transfer signal; and a second transistor which is connected between the floating diffusion node and a power supply voltage and forms a charge path in response to a reset signal, wherein a level of the transfer signal during the first time is a transfer adjusting voltage lower than a voltage for turning on the first transistor and a level of the reset signal is a reset enable voltage for turning on the second transistor.

In example embodiments, a level of the transfer signal during the second time is a voltage lower than the transfer adjusting voltage.

In example embodiments, the CMOS image sensor comprises a third transistor which is connected to a power supply voltage and forms a charge path in response to a voltage of the floating diffusion node; and a fourth transistor which is connected to the third transistor and forms a charge path in response to a selection signal, wherein the selection signal has a ground voltage during the first and second times.

Advantageous Effects

With an embodiment of the inventive concept, a gate voltage of a transfer transistor is changed while a photo sensor element generates photoelectrons. Thus, a dynamic range of a CMOS image sensor increases.

MODE FOR INVENTION

The present invention will now be described in detail with reference to the accompanying drawings, in which exemplary embodiments of the invention are shown.

Figure 1:
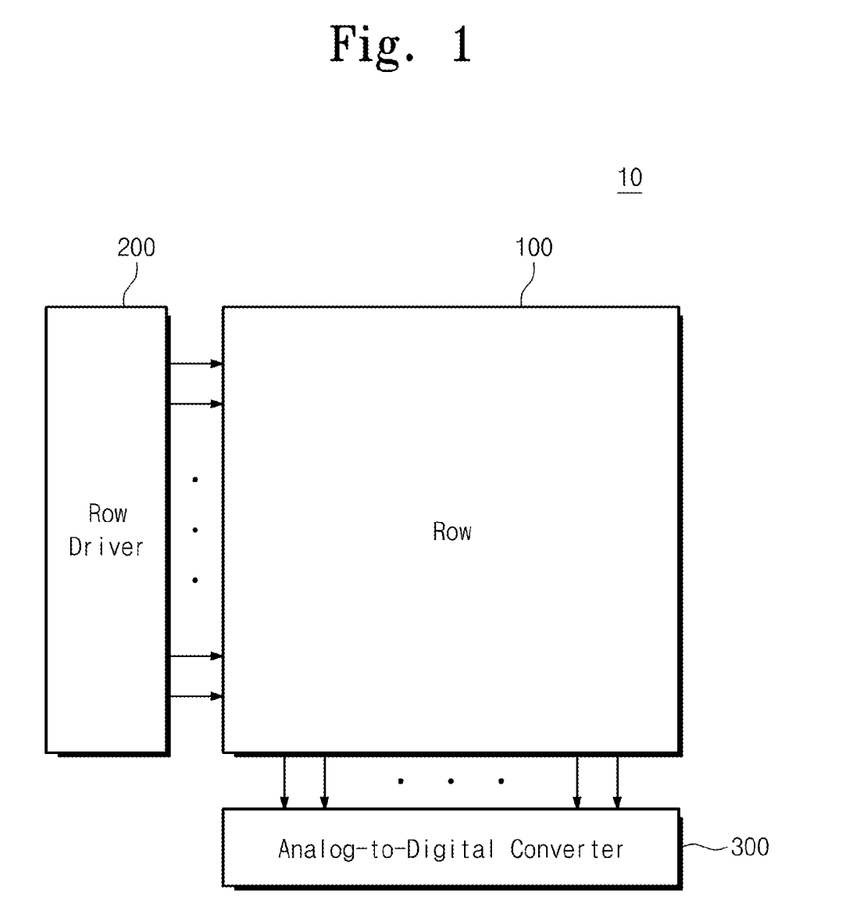
FIG. 1 is a block diagram schematically illustrating a CMOS image sensor 10 according to an embodiment of the inventive concept.

FIG. 1 is a block diagram schematically illustrating a CMOS image sensor 10 according to an embodiment of the inventive concept. Referring to FIG. 1, a CMOS image sensor 10 may include an APS array 100, a row driver 200, and an analog-to-digital converter (ADC) 300.

The APS array 100 may include a plurality of pixel circuits. For example, the pixel circuits may be arranged along a plurality of rows and a plurality of columns. Each of the pixel circuit may include a photo sensor element. The photo sensor element may be a photodiode, for example. Alternatively, the photo sensor element may be a photo-transistor. For ease of description, it is assumed that the photo sensor element is a photodiode.

The APS array 100 may generate an image signal using photodiodes. That is, the APS array 100 may generate an image signal by sensing light using photodiodes and converting the sensed light into an electric signal. For example, image signals output from the APS array 100 may be analog image signals corresponding to three colors R, G, and B.

The analog-to-digital converter 300 may convert an analog image signal from the APS array 100 to a digital signal. For example, the analog-to-digital converter 300 may convert an analog image signal to a digital signal using a CDS (Correlated Double Sampling) manner. For example, a digital signal converted by the analog-to-digital converter 300 may be provided to a signal processing unit.

The row driver 200 may select rows of the APS array 100. For example, the row driver 200 may sequentially select the rows of the APS array 100. The CMOS image sensor 10 may further comprise a controller which generates address signals to select pixel circuits or to output sensed image signals. Below, a pixel circuit according to an embodiment of the inventive concept will be more fully described with reference to FIG. 2.

Figure 2:
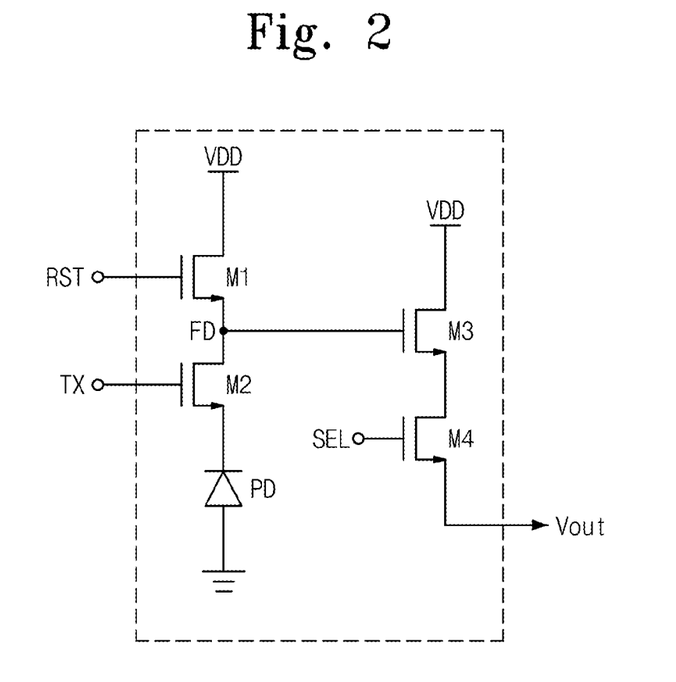
FIG. 2 is a circuit diagram schematically illustrating a pixel circuit 110 according to an embodiment of the inventive concept.

FIG. 2 is a circuit diagram schematically illustrating a pixel circuit 110 according to an embodiment of the inventive concept. For example, a pixel circuit 110 of FIG. 2 may be included in an APS array 100 of FIG. 1. Referring to FIG. 2, the pixel circuit 110 may include first to fourth transistors M1 to M4 and a photodiode PD.

The first transistor M1 may be connected between a power supply voltage VDD and a floating diffusion (FD) node. A drain of the first transistor M1 may be connected to the power supply voltage VDD. A source of the first transistor M1 may be connected to the FD node. The first transistor M1 may form a charge path in response to a reset signal RST. For example, the first transistor M1 may reset the FD node with the power supply voltage VDD in response to the reset signal RST. The first transistor M1 may be a reset transistor.

The second transistor M2 may be connected between the FD node and the photodiode PD. A drain of the second transistor M2 may be connected to the FD node. A source of the second transistor M2 may be connected to the photodiode PD. The second transistor M2 may form a charge path in response to a transfer signal TX. The second transistor M2 may transmit photo-generated electron in the photodiode PD to the FD node in response to the transfer signal TX. For example, the second transistor M2 may be a transfer transistor.

In example embodiments of the inventive concept, while photoelectrons are generated in the photodiode PD, a voltage level of the transfer signal TX may vary. For example, while photoelectrons are generated in the photodiode PD, a voltage level of the transfer signal TX may be changed to a ground voltage from a transfer adjusting voltage.

Herein, the transfer adjusting voltage may mean a voltage which is lower than a transfer enable voltage and higher than a ground voltage. The transfer enable voltage may mean a voltage for turning on the second transistor M2.

The pixel circuit 110 according to an embodiment of the inventive concept may vary a charge accumulation capacity of the photodiode PD for accumulation of photoelectrons by varying a voltage level of the transfer signal TX.

The photodiode PD may be located between the second transistor M2 and a ground voltage. The photodiode PD may sense light to generate photoelectrons.

In example embodiments of the inventive concept, the photodiode PD may generate photoelectrons to accumulate them. For example, the photodiode PD may accumulate photoelectrons generated during a first integration time Tint 1 and a second integration time Tint 2.

Herein, the first integration time Tint 1 may be a time when photoelectrons are generated under a condition that the transfer signal TX has the transfer adjusting voltage. The second integration time Tint 2 may be a time when photoelectrons are generated under a condition that the transfer signal TX has a ground voltage.

In this case, a ratio of the first integration time Tint 1 to the second integration time Tint 2 may be adjusted properly. A dynamic range of a CMOS image sensor according to an embodiment of the inventive concept may be increased by varying the ratio of the first integration time Tint 1 to the second integration time Tint 2.

Continuing to refer to FIG. 2, the third transistor M3 may be located between the power supply voltage VDD and the fourth transistor M4. A drain of the third transistor M3 may be connected to the power supply voltage VDD. A source of the third transistor M3 may be connected with a drain of the fourth transistor M4. The third transistor M3 may form a charge path in response to a voltage of the FD node. For example, a voltage of the FD node may be transferred to a gate of the third transistor M3. The third transistor M3 may be a source follower transistor.

The fourth transistor M4 may be connected with the third transistor M3, and may form a charge path in response to a selection signal SEL. That is, the fourth transistor M4 may output an output signal Vout in response to the selection signal SEL.

As described above, in example embodiments of the inventive concept, a voltage level of the transfer signal TX may be changed to a ground voltage from the transfer adjusting voltage. In this case, a dynamic range of a CMOS image sensor according to an embodiment of the inventive concept may be increased by varying the first integration time Tint 1 to the second integration time Tint 2.

The reason may be that the CMOS image sensor according to an embodiment of the inventive concept has the same effect as synthesizing an image captured when light is incident for a long time and an image captured when light is incident for a short time. Below, an operation of the CMOS image sensor according to an embodiment of the inventive concept will be more fully described with reference to the pixel circuit 110 of FIG. 2.

Figure 3:
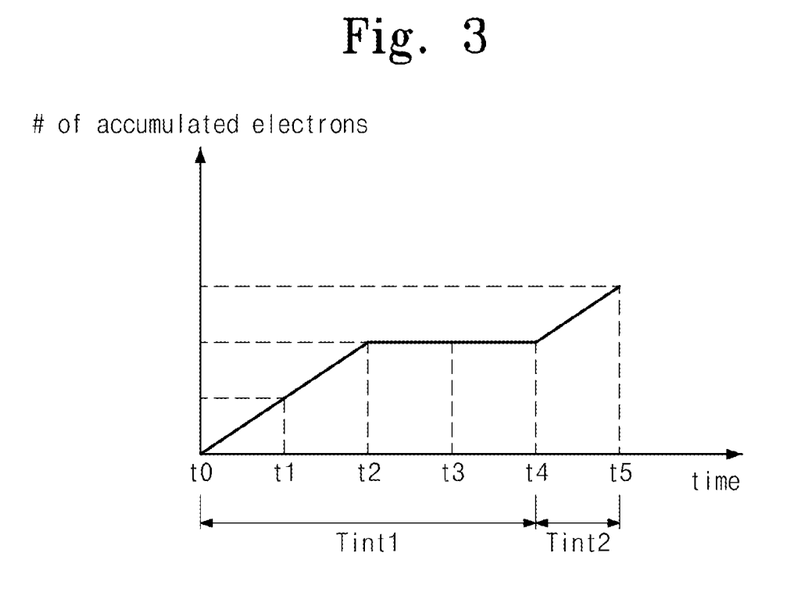
FIG. 3 shows the number of photoelectrons accumulated at a photodiode during first and second integration times.

FIGS. 3 to 9 are diagrams for describing an operation of a pixel circuit 110 of FIG. 2 according to an embodiment of the inventive concept. More particularly, FIG. 3 shows the number of photoelectrons accumulated at a photodiode PD (refer to FIG. 2) during first and second integration times Tint 1 and Tint 2. FIGS. 4 to 9 show electric potential levels at an initial time t0 to a fifth time t5 of FIG. 3.

For ease of description, it is assumed that the intensity of light is sufficiently strong in FIGS. 3 to 9. That is, it is assumed that a photodiode PD is saturated by photoelectrons generated during a first integration time Tint 1. Meanwhile, since a second integration time Tint 2 is short, it is assumed that a photodiode PD is not saturated by photoelectrons generated during the second integration time Tint 2.

Figure 4:
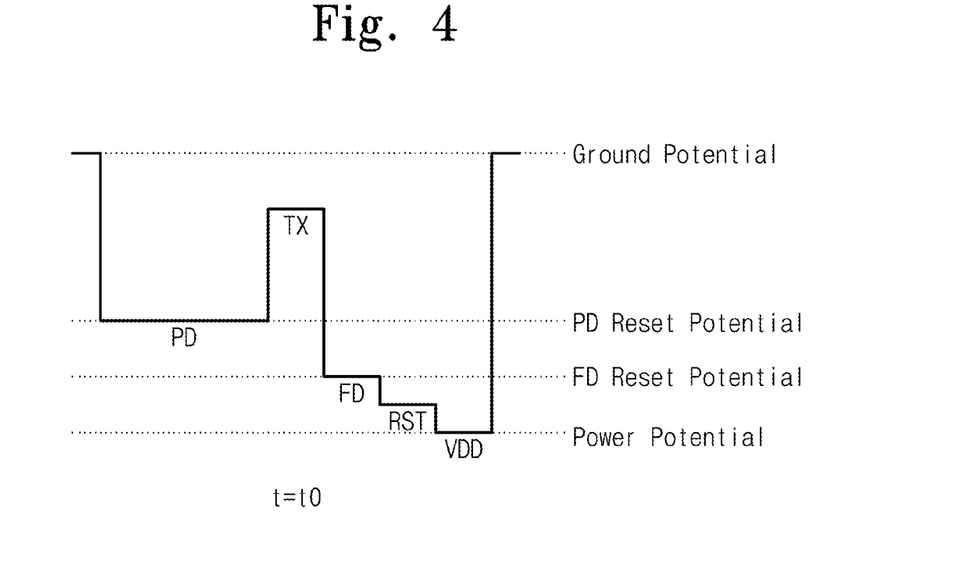
FIG. 4 shows electric potential levels at an initial time of FIG. 3.

Referring to FIGS. 3 and 4, there may be illustrated electric potential levels and the number of photoelectrons accumulated at the photodiode PD during the first integration time Tint 1.

It is assumed that a potential level of the photodiode PD at the initial time t0 is a PD reset potential. It is assumed that a potential level of a FD node at the initial time t0 is a FD reset potential. It is assumed that a potential level of a power supply voltage VDD at the initial time t0 is a power supply potential. It is assumed that a potential level of the ground voltage at the initial time t0 is a ground potential. It is assumed that a potential level of a transfer signal TX at the initial time t0 is a transfer adjusting potential. Herein, the transfer adjusting potential may mean an electric potential corresponding to a transfer adjusting voltage.

Figure 5:
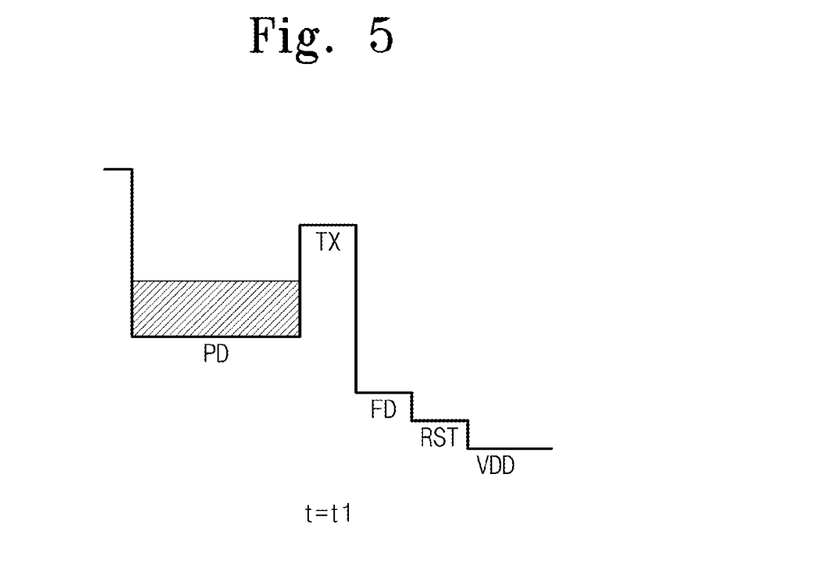
FIG. 5 shows electric potential levels at a first time of FIG. 3.

Referring to FIGS. 3 and 5, there may be illustrated electric potential levels and the number of photoelectrons accumulated at the photodiode PD during a first time t1.

If light is incident onto the photodiode PD, the photodiode PD may generate photoelectrons. In this case, the ground potential, the photodiode PD and a potential level of the transfer signal TX may form a well structure. That is, since a potential level of the transfer signal TX is a transfer adjusting voltage, a second transistor M2 (refer to FIG. 2) may not be fully turned on. Thus, photoelectrons generated by the photodiode PD may be accumulated at a well. In other words, the photoelectrons may be accumulated at the photodiode PD.

Figure 6:
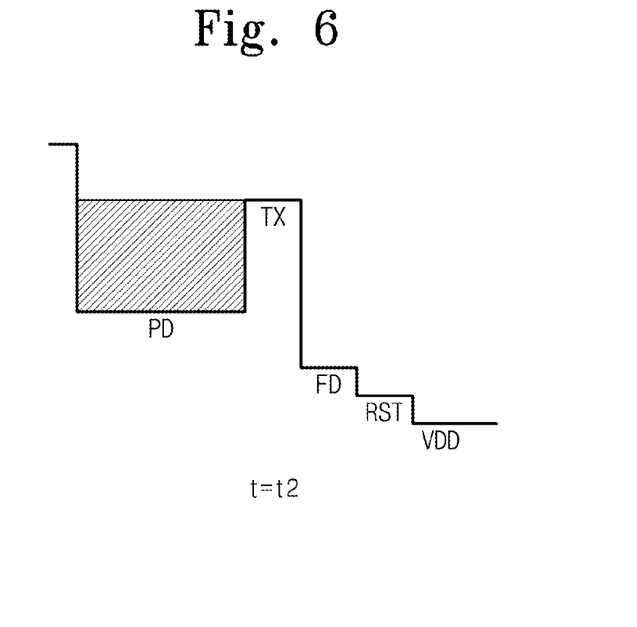
FIG. 6 shows electric potential levels at a second time of FIG. 3.

Referring to FIGS. 3 and 6, there may be illustrated electric potential levels and the number of photoelectrons accumulated at the photodiode PD during a second time t1. Since the first integration time Tint 1 is sufficiently long, the photodiode PD may be saturated at the second time t2.

Figure 7:
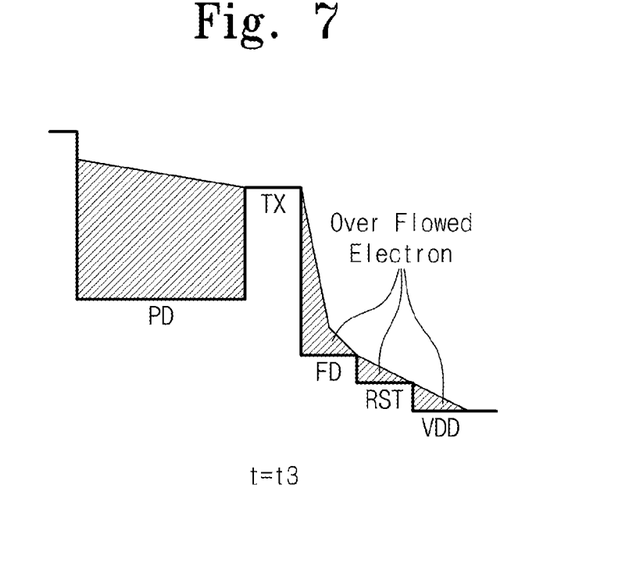
FIG. 7 shows electric potential levels at a third time of FIG. 3.

Referring to FIGS. 3 and 7, there may be illustrated electric potential levels and the number of photoelectrons accumulated at the photodiode PD during a third time t3.

At the second time t2, the photodiode PD may already be at a saturation state. Thus, excessive photoelectrons generated at the third time t3 may be transferred to the FD node. In this case, since a potential level of a selection signal RST is low, a first transistor M1 (refer to FIG. 2) may be at a turn-on state. Thus, the excessively generated photoelectrons may be discharged through the power supply potential VDD.

As described above, referring to FIGS. 3 to 7, photoelectrons generated during the first integration time Tint 1 may be accumulated at the photodiode PD. In this case, a potential level of the transfer signal TX may be a transfer electric potential level. Also, the excessively generated photoelectrons may be discharged through the power potential VDD.

Figure 8:
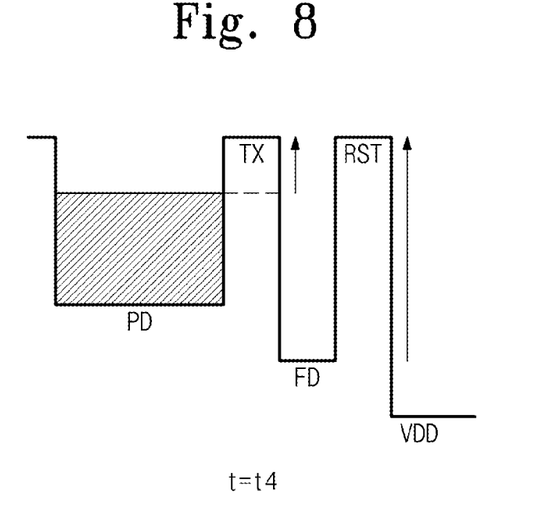
FIG. 8 shows electric potential levels at a fourth time of FIG. 3.

Continuing to refer to FIGS. 3 and 8, there may be illustrated electric potential levels and the number of photoelectrons accumulated at the photodiode PD during a fourth time t4.

At the fourth time t4, a potential level of the transfer signal TX may increase to a ground potential from a transfer electric potential level. Thus, the second transistor M2 may be fully turned off. Thus, a charge accumulation capacity of the photodiode PD capable of accumulating photoelectrons may increase.

Figure 9:
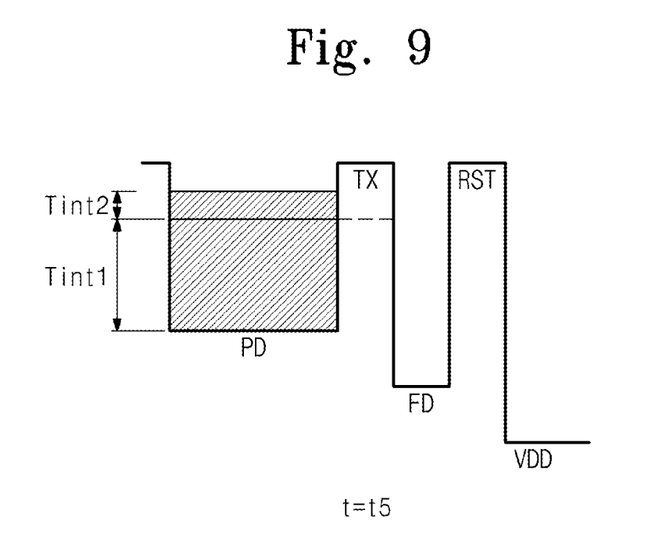
FIG. 9 shows electric potential levels at a fifth time of FIG. 3.

Referring to FIGS. 3 and 9, there may be illustrated electric potential levels and the number of photoelectrons accumulated at the photodiode PD during a fifth time t5.

Since a capacity of a well of the photodiode PD increases at the fourth time t4, photoelectrons generated during the fifth time t5 at the fourth time t4 may be accumulated. That is, photoelectrons generated during the second integration time Tint 2 may be accumulated at the photodiode PD.

As described above, referring to FIGS. 3, 8, and 9, photoelectrons generated during the second integration time Tint 2 may be accumulated at the photodiode PD. As a result, referring to FIG. 9, both photoelectrons generated during the first integration time Tint 1 and photoelectrons generated during the second integration time Tint 2 may be accumulated at the photodiode PD.

In this case, in example embodiments of the inventive concept, the ratio of the first integration time Tint 1 to the second integration time Tint 2 may be set differently. For example, referring to FIGS. 3 to 9, the first integration time Tint 1 may be set to be longer than the second integration time Tint 2.

In this case, photoelectrons accumulated at the photodiode PD during the first integration time Tint 1 may be photoelectrons capturing an image when light is incident for a long time. Photoelectrons accumulated at the photodiode PD during the second integration time Tint 2 may be photoelectrons capturing an image when light is incident for a short time.

That is, both photoelectrons generated when light is incident for a short time and photoelectrons generated when light is incident for a long time may be accumulated at the photodiode PD. Thus, a CMOS image sensor according to an embodiment of the inventive concept may have the same effect as the case that there are synthesized an image captured when light is incident for a long time and an image captured when light is incident for a short time.

As a result, a dynamic range of the CMOS image sensor according to an embodiment of the inventive concept may increase. The CMOS image sensor according to an embodiment of the inventive concept may capture an image once, while a typical dual capture manner captures an image at least two times.

Also, since both photoelectrons generated when light is incident for a short time and photoelectrons generated when light is incident for a long time are accumulated at the photodiode PD, the CMOS image sensor according to an embodiment of the inventive concept may not necessitate an external device which synthesizes an image captured when light is incident for a long time and an image captured when light is incident for a short time.

Meanwhile, in FIGS. 3 to 9, it is assumed that the intensity of light is sufficiently strong to such an extent as to saturate the photodiode PD during the first integration time Tint 1. This may be only exemplary. Below, an operation of a pixel circuit 110 when the intensity of light is weak unlike FIGS. 3 to 9 will be more fully described with reference to FIGS. 10 to 14.

Figure 10:
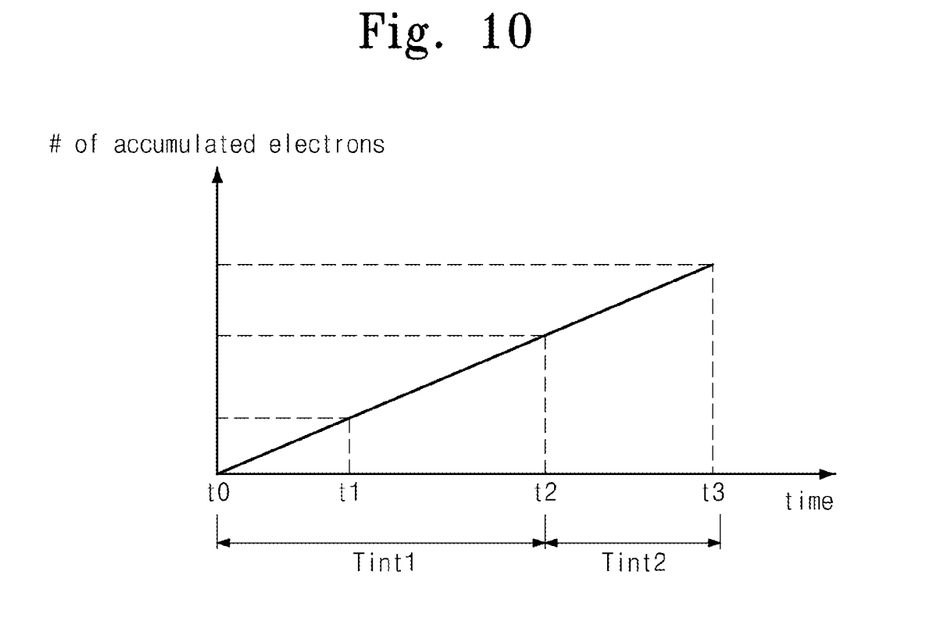
FIG. 10 shows the number of photoelectrons accumulated at a photodiode during first and second integration times.

FIGS. 10 to 14 are diagrams for describing an operation of a pixel circuit 110 of FIG. 2 according to another embodiment of the inventive concept. More particularly, FIG. 10 shows the number of photoelectrons accumulated at a photodiode PD (refer to FIG. 2) during first and second integration times Tint 1 and Tint 2. FIGS. 11 to 14 show electric potential levels at an initial time t0 to a third time t3 of FIG. 10.

Unlike FIGS. 3 to 9, it is assumed that the intensity of light is weak in FIGS. 10 to 14. That is, it is assumed that a photodiode PD is not saturated by photoelectrons generated during a first integration time Tint 1. Also, it is assumed that a photodiode PD is not saturated by photoelectrons generated during a second integration time Tint 2.

Figure 11:
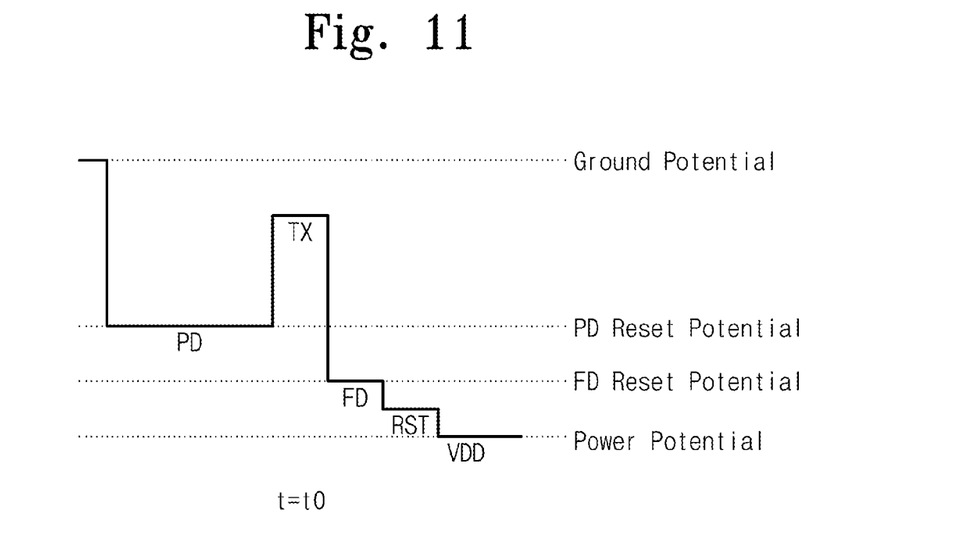
FIG. 11 shows electric potential levels at an initial time of FIG. 10.

Referring to FIGS. 10 and 11, there may be illustrated an electric potential level at an initial time t0.

It is assumed that a potential level of the photodiode PD at the initial time t0 is a PD reset potential. It is assumed that a potential level of a FD node at the initial time t0 is a FD reset potential. It is assumed that a potential level of a transfer signal TX at the initial time t0 is a transfer adjusting potential.

Figure 12:
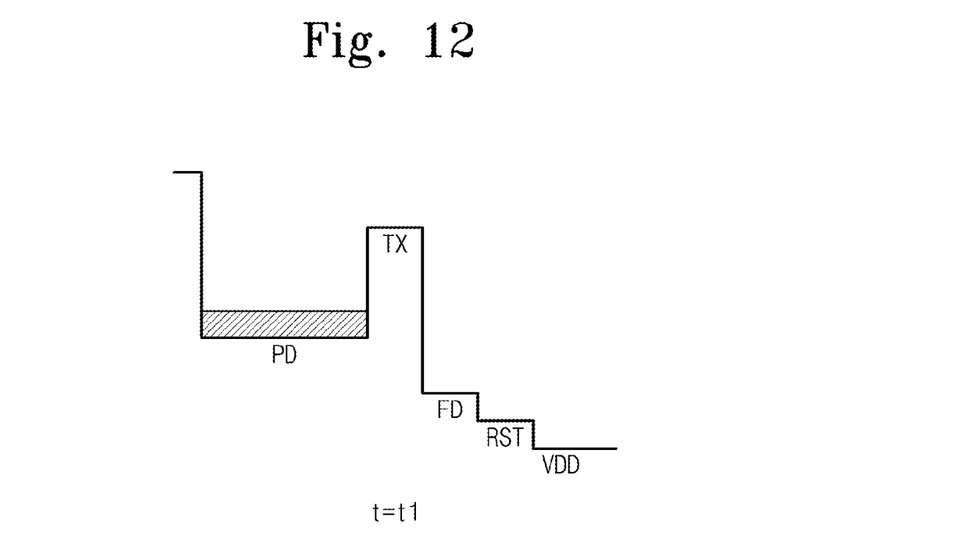
FIG. 12 shows electric potential levels at a first time of FIG. 10.

Referring to FIGS. 10 and 12, there may be illustrated electric potential levels and the number of photoelectrons accumulated at the photodiode PD at a first time t1.

If light is incident onto the photodiode PD, the photodiode PD may generate photoelectrons. In this case, since a potential level of the transfer signal TX is a transfer adjusting potential, a second transistor M2 (refer to FIG. 2) may not be fully turned on. Thus, photoelectrons generated in the photodiode PD may be accumulated at a well. In other words, the photoelectrons may be accumulated at the photodiode PD.

Figure 13:
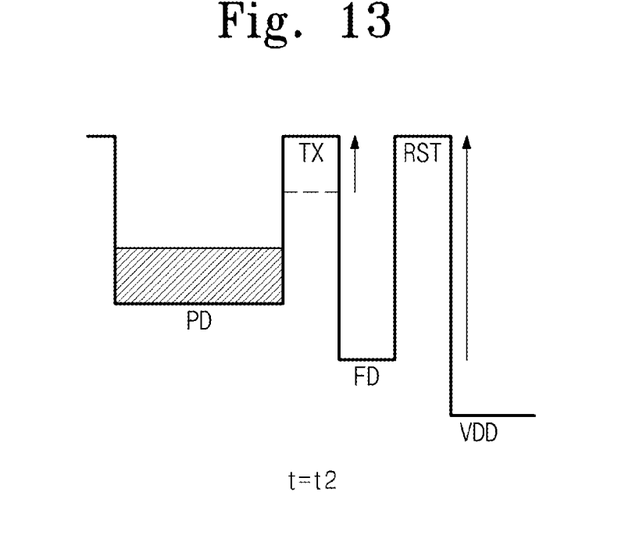
FIG. 13 shows electric potential levels at a second time of FIG. 10.

Referring to FIGS. 10 and 13, there may be illustrated electric potential levels and the number of photoelectrons accumulated at the photodiode PD at a second time t2. Since the intensity of light is weak, the photodiode PD may not be saturated by photoelectrons generated during initial to second times t0 to t1. That is, the photodiode PD may not be saturated by photoelectrons generated during a first integration time Tint 1.

Meanwhile, at the second time t2, a potential level of the transfer signal TX may increase to a ground potential from a transfer electric potential level. Thus, the second transistor M2 may be fully turned off. Thus, a charge accumulation capacity of the photodiode PD capable of accumulating photoelectrons may increase. In this case, a potential level of a selection signal RST may increase to a ground potential.

Figure 14:
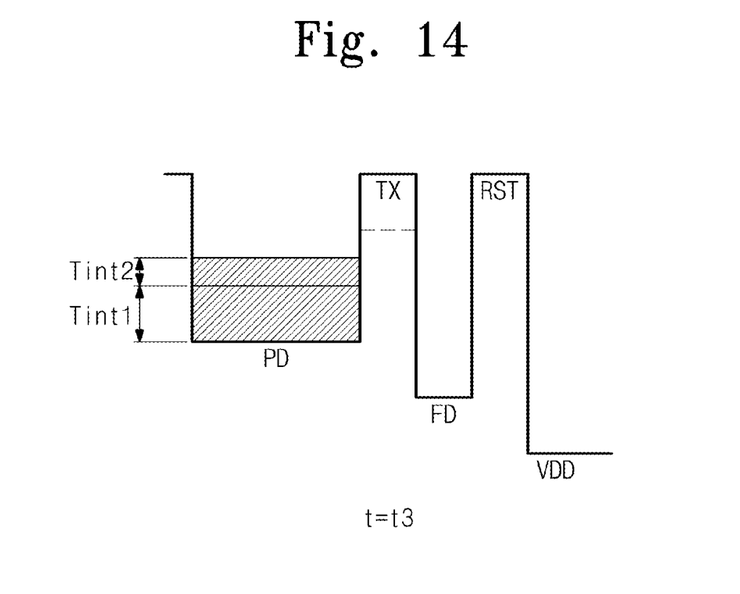
FIG. 14 shows electric potential levels at a third time of FIG. 10.

Referring to FIGS. 10 and 14, there may be illustrated electric potential levels and the number of photoelectrons accumulated at the photodiode PD at a third time t3. Photoelectrons generated during the second and third times t2 and t3 may be accumulated at the photodiode PD. That is, photoelectrons generated during a second integration time Tint 2 may be accumulated at the photodiode PD.

In this case, both photoelectrons generated during the first integration time Tint 1 and photoelectrons generated during the second integration time Tint 2 may be accumulated at the photodiode PD. Thus, although the intensity of light is weak, the CMOS image sensor according to an embodiment of the inventive concept may have the same characteristic as the case that the intensity of light is sufficiently strong.

Figure 15:
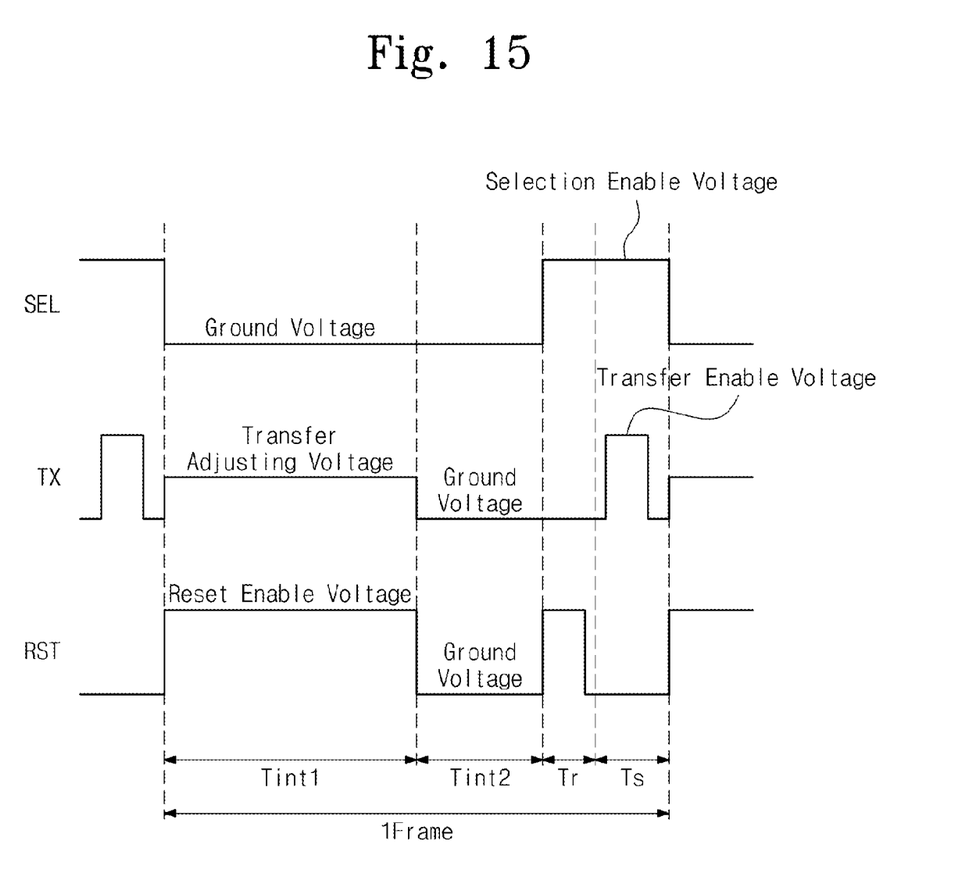
FIG. 15 is a timing diagram illustrating an operation of a pixel circuit of FIG. 2.

FIG. 15 is a timing diagram illustrating an operation of a pixel circuit 110 of FIG. 2. More particularly, an operation of a pixel circuit 110 of FIG. 2 according to voltage levels of a selection signal SEL, a transfer signal TX and a reset signal RST will be described with reference to FIG. 15. For ease of description, it is assumed that a first integration time Tint 1 is longer than a second integration time Tint 2.

At a first integration time Tint 1, a voltage level of the transfer signal TX may be a transfer adjusting voltage. The transfer adjusting voltage may be lower than a transfer enable voltage for turning on a second transistor M2. Also, the transfer adjusting voltage may be higher than a ground voltage.

In this case, the second transistor M2 (refer to FIG. 2) may not be fully turned on. Thus, generated photoelectrons may be accumulated at a photodiode PD. Since the first integration time Tint 1 is longer than the second integration time Tint 2, photoelectrons generated when light is incident for a long time may be accumulated at the photodiode PD.

Meanwhile, at the first integration time Tint 1, a voltage level of the reset signal RST may be a reset enable voltage. Thus, the second transistor M2 may be turned on. Thus, in the case that the photodiode PD is at a saturation state, excessively generated photoelectrons may be discharged to a power supply voltage VDD through a first transistor M1.

At the second integration time Tint 2, a voltage level of the transfer signal TX may transition to a ground voltage from a transfer adjusting voltage. That is, the second transistor M2 may be fully turned on.

In this case, since the second transistor M2 is fully turned on, a capacity of the photodiode PD capable of accumulating photoelectrons may increase. Thus, generated photoelectrons may be accumulated at the photodiode PD.

Since the second integration time Tint 2 is shorter than the first integration time Tint 1, photoelectrons generated when light is incident for a short time may be accumulated at the photodiode PD. As a result, both photoelectrons generated when light is incident for a short time and photoelectrons generated when light is incident for a long time may be accumulated at the photodiode PD.

Meanwhile, at the second integration time Tint 2, a voltage level of the reset signal RST may be a ground voltage. That is, during the second integration time Tint 2, a first transistor M1 may be turned off. Thus, in the case that the photodiode PD is at a saturation state, excessively generated photoelectrons may be accumulated at a floating diffusion (FD) node (refer to FIG. 2).

At a reset time Tr, a voltage level of the reset signal RST may transition to a reset enable voltage from a ground voltage. That is, the first transistor M1 may be turned on. Thus, a voltage of the FD node may be reset with the power supply voltage VDD.

Also, at the reset time Tr, a voltage level of the selection signal SEL may transition to a selection enable voltage from a ground voltage. That is, a fourth transistor M4 (refer to FIG. 2) may be turned on. Since a voltage of the FD node is transferred to a gate of a third transistor M3 (refer to FIG. 2), the fourth transistor M4 may output a voltage Vout corresponding to a voltage of the FD node reset.

At a sensing time Ts, a voltage level of the reset signal RST may transition to a ground voltage from the reset enable voltage. That is, the first transistor M1 may be turned off. A voltage level of the transfer signal TX may transition to the transfer enable voltage from a ground voltage. That is, the second transistor M2 may be turned on. Thus, photoelectrons accumulated at the photodiode PD during first and second integration times Tint 1 and Tint 2 may be transferred to the FD node.

In this case, a voltage level of the selection signal SEL may maintain a select enable voltage. That is, the fourth transistor M4 may maintain a turn-on state. Since a voltage of the FD node is transferred to a gate of the third transistor M3, the fourth transistor M4 may output a voltage Vout corresponding to a potential level of photoelectrons transferred to the FD node.

As described above, photoelectrons generated during the first and second integration times Tint 1 and Tint 2 may be accumulated at the photodiode PD. A CMOS image sensor according to an embodiment of the inventive concept may increase a dynamic range by sensing photoelectrons generated during the first and second integration times Tint 1 and Tint 2.

Meanwhile, the CMOS image sensor according to an embodiment of the inventive concept may adjust a dynamic range by adjusting a voltage level of the transfer signal TX. Also, the CMOS image sensor according to an embodiment of the inventive concept may adjust the dynamic range by changing a ratio of the first integration time Tint 1 to the second integration time Tint 2. This will be more fully described with reference to FIGS. 16 and 17.

Figure 16:
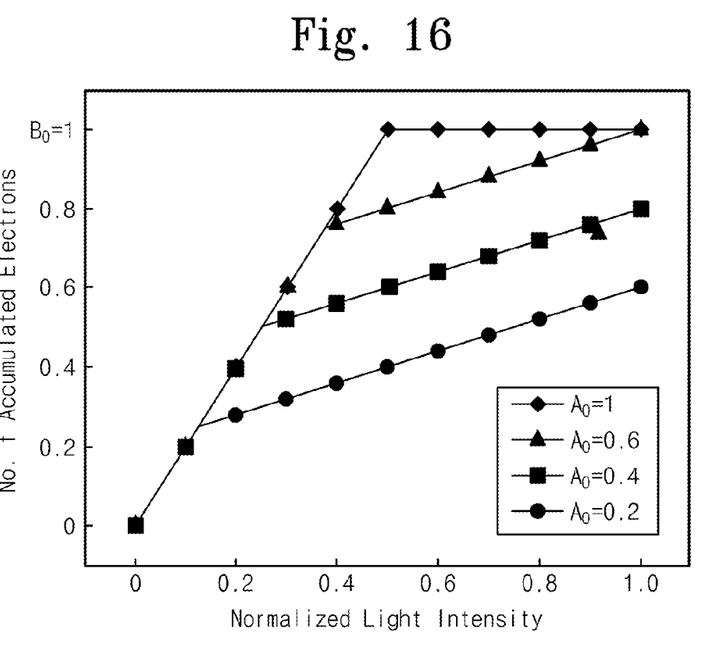
FIG. 16 shows a simulation result of a variation in a dynamic range according to a variation in a voltage level of a transfer signal.

FIG. 16 shows a simulation result of a variation in a dynamic range according to a variation in a voltage level of a transfer signal TX.

Referring to FIG. 16, a point where a slope of a graph is varied may be changed by varying a voltage level of a transfer signal TX. Thus, a dynamic range may be changed. In a simulation result, a ratio of the first integration time Tint 1 to the second integration time Tint 2 may be set to about 7:3.

Meanwhile, a simulation result of FIG. 16 will be described with reference to the following equations 1 to 5. Equations 1 and 2 show photoelectrons Qo accumulated at a first integration time Tint 1. Equations 3 to 5 show photoelectrons Qo accumulated at the first and second integration times Tint 1 and Tint 2.

$$Qo = go*Io*\text{Tint } 1, go*Io*\text{Tint } 1 < Ao \qquad \text{(Equation 1)}$$

$$Qo = Ao, go*Io*\text{Tint } 1 > Ao \qquad \text{(Equation 2)}$$

Herein, it is assumed that high intensity is "Io" and a photoelectron generation ratio is "go". "Ao" may indicate the number of photoelectrons saturated at a photodiode PD at a state where a voltage level of a transfer signal TX is V1.

$$Qo = go*Io*(\text{Tint } 1 + \text{Tint } 2), go*Io*\text{Tint } 1 < Ao \qquad \text{(Equation 3)}$$

$$Qo = Ao + go*Io*\text{Tint } 2, go*Io*\text{Tint } 1 > Ao \& go*Io*(\text{Tint } 1 + \text{Tint } 2) < Bo \qquad \text{(Equation 4)}$$

$$Qo = Bo, go*Io*(\text{Tint } 1 + \text{Tint } 2) > Bo \qquad \text{(Equation 5)}$$

Herein, "Bo" may indicate the number of photoelectrons accumulated at the photodiode PD when the transfer signal TX has a ground voltage.

Figure 17:
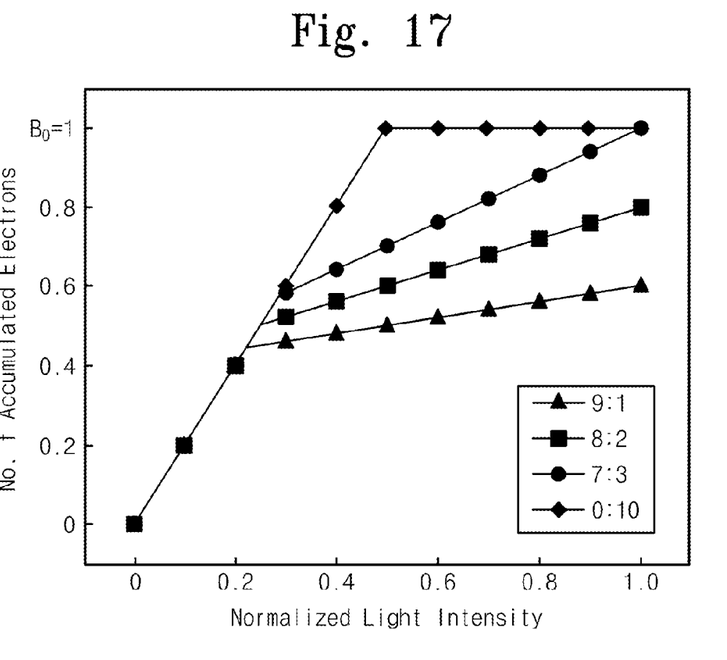
FIG. 17 shows a simulation result of a variation in a dynamic range according to a variation in a ratio of a first integration time to a second integration time.

FIG. 17 shows a simulation result of a variation in a dynamic range according to a variation in a ratio of the first integration time Tint 1 to the second integration time Tint 2. For ease of description, in FIG. 17, experiment may be executed at a state where A0=0.4.

Referring to FIG. 17, a point where a slope of a graph is varied may be changed by varying a ratio of the first integration time Tint 1 to the second integration time Tint 2. Thus, a dynamic range may be changed.

MODE FOR CARRYING THE INVENTION

Meanwhile, the above description may be comprehended to be exemplary. However, the inventive concept is not limited thereto. For example, in FIGS. 3 to 17, there is described the case that the first integration time Tint 1 is longer than the second integration time Tint 2. This may be exemplary. The second integration time Tint 2 may be set to be longer than the first integration time Tint 1.

As another example, in FIGS. 3 to 17, there is described the case that a voltage level of a transfer signal TX is a ground voltage at the second integration time Tint 2. This may be exemplary. There may be applied a voltage lower than a transfer adjusting voltage at the second integration time Tint 2.

As still another example, in FIG. 2, the spirit of the inventive concept is described using a pixel circuit having four transistors. This may be exemplary. The spirit of the inventive concept may be applied to a pixel circuit having three transistors. Also, the spirit of the inventive concept may be applied to a 3 or 4-transistor pixel circuit having a capacitor at a floating diffusion (FD) node.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

The invention claimed is:

1. An operating method of a CMOS image sensor comprising:
   generating photoelectrons at a photo sensor element during a first time;
   generating photoelectrons at the photo sensor element during a second time shorter than the first time; and
   sensing the photoelectrons generated at the photo sensor element,
   wherein a gate voltage of a transfer transistor connected to the photo sensor element is set differently at the first time and the second time,
   wherein the gate voltage of the transfer transistor during the first time is set to a transfer adjusting voltage higher than a ground voltage and lower than a voltage for turning the transfer transistor on.

2. The operating method of claim 1, wherein the gate voltage of the transfer transistor during the second time is set to a voltage lower than the transfer adjusting voltage.

3. The operating method of claim 1, wherein the photoelectrons generated during the first time are accumulated at the photo sensor element.

4. The operating method of claim 1, wherein the transfer transistor has a source connected to the photo sensor element and a drain connected to a floating diffusion node, and
   wherein the sensing the photoelectrons generated at the photo sensor element comprises:
   resetting the floating diffusion node with a power supply voltage; and
   transferring the photoelectrons generated during the first and second times to the floating diffusion node.

5. The operating method of claim 2, wherein the gate voltage of the transfer transistor during the second time is a ground voltage.

6. The operating method of claim 3, wherein the photoelectrons generated during the second time are accumulated at the photo sensor element where the photoelectrons generated during the first time are accumulated.

7. , An operating method of a CMOS image sensor which includes a photo sensor element and a transfer transistor forming a charge path formed between the photo sensor element and a floating diffusion node, the operating method comprising changing a gate voltage level of the transfer transistor while the photo sensor element generates photoelectrons,
   wherein a gate voltage level of the transfer transistor is changed from a first voltage to a second voltage lower than the first voltage while the photo sensor element generates photoelectrons,
   wherein the first voltage is lower than a voltage for turning on the transfer transistor and higher than a ground voltage.

8. The operating method of claim 7, wherein the second voltage is a ground voltage.

9. The operating method of claim 7, wherein the first voltage is applied to a gate of the transfer transistor during a first time and the second voltage is applied to the gate of the transfer transistor during a second time shorter than the first time.

10. The operating method of claim 9, wherein photoelectrons generated during the first and second times are accumulated at the photo sensor element.

11. The operating method of claim 10, wherein the photoelectrons accumulated at the photo sensor element during the first and second times are transferred to the floating diffusion node.

12. A CMOS image sensor comprising:
    a photo sensor element which generates photoelectrons during first and second times; and
    a transfer transistor which forms a charge path between the photo sensor element and a floating diffusion node in response to a transfer signal,
    wherein a voltage level of the transfer signal is set to be different during the first and second times,
    wherein a voltage level of the transfer signal during the first time is a first voltage lower than a voltage for turning on the transfer transistor and higher than a ground voltage, and the voltage level of the transfer signal during the second time is a second voltage lower than the first voltage.

13. The CMOS image sensor of claim 12, wherein the first time is longer than the second time.

14. The CMOS image sensor of claim 12, wherein photoelectrons generated at the first and second times are accumulated at a well of the photo sensor element.

15. A CMOS image sensor comprising:
    a photo sensor element which generates photoelectrons during a first time and a second time shorter than the first time;
    a first transistor which is connected between the photo sensor element and a floating diffusion node and forms a charge path in response to a transfer signal; and
    a second transistor which is connected between the floating diffusion node and a power supply voltage and forms a charge path in response to a reset signal,
    wherein a level of the transfer signal during the first time is a transfer adjusting voltage lower than a voltage for turning on the first transistor and a level of the reset signal is a reset enable voltage for turning on the second transistor.

16. The CMOS image sensor of claim 15, wherein a level of the transfer signal during the second time is a voltage lower than the transfer adjusting voltage.

17. The CMOS image sensor of claim 15, further comprising:
    a third transistor which is connected to a power supply voltage and forms a charge path in response to a voltage of the floating diffusion node; and
    a fourth transistor which is connected to the third transistor and forms a charge path in response to a selection signal,
    wherein the selection signal has a ground voltage during the first and second times.

* * * * *